(12) United States Patent
Luo et al.

(10) Patent No.: US 10,886,766 B2
(45) Date of Patent: Jan. 5, 2021

(54) METHOD AND DEVICE FOR MULTI-STAGE BATTERY CHARGING

(71) Applicant: Contemporary Amperex Technology Co., Limited, Ningde (CN)

(72) Inventors: Fuping Luo, Ningde (CN); Shengwei Wang, Ningde (CN); Xinxin Du, Ningde (CN); Xin Fu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 336 days.

(21) Appl. No.: 15/965,845

(22) Filed: Apr. 28, 2018

(65) Prior Publication Data

US 2018/0316206 A1 Nov. 1, 2018

(30) Foreign Application Priority Data

Apr. 28, 2017 (CN) .......................... 2017 1 0298449

(51) Int. Cl.
*H01M 10/44* (2006.01)
*H02J 7/00* (2006.01)
(Continued)

(52) U.S. Cl.
CPC ...... *H02J 7/007184* (2020.01); *G01R 31/382* (2019.01); *H01M 10/0525* (2013.01);
(Continued)

(58) Field of Classification Search
CPC .. H02J 7/007184; H02J 7/00712; H02J 7/008; H02J 7/0077; H02J 7/0071;
(Continued)

(56) References Cited

U.S. PATENT DOCUMENTS

| 4,163,934 A | * | 8/1979 | Lawn | ................ | H02J 7/007184 320/160 |
| 5,508,598 A | * | 4/1996 | Al-Abassy | ............ | H02J 7/0086 320/129 |

(Continued)

FOREIGN PATENT DOCUMENTS

| CN | 1845418 A | 10/2006 |
| CN | 101636872 A | 1/2010 |

(Continued)

OTHER PUBLICATIONS

The first Office Action and Search Report for Chinese Application No. 201710298449.4, dated Dec. 19, 2018, 9 pages.

*Primary Examiner* — John T Trischler
(74) *Attorney, Agent, or Firm* — Law Offices of Liaoteng Wang

(57) ABSTRACT

A method, an apparatus and a device for charging a battery are provided. The method may include: defining a charging current $I_n$ for an Nth charging stage of a charging process based on charging capability of the battery, wherein $I_n<I_{n-1}$; defining a charge cutoff voltage $V_n$ for the Nth charging stage of the charging process, wherein $V_n>V_{n-1}$ and $V_n$ is smaller than a theoretical charge cutoff voltage $V_{max}$; in case that the N-1th charging stage is not a last charging stage, charging the battery with $I_{n-1}$ during the N-1th charging stage and proceeding to the Nth charging stage when a voltage across the battery reaches $V_{n-1}$; and in case that the N-1 th charging stage is the last charging stage, charging the battery with $I_{n-1}$ during the N-1th charging stage and stopping charging when the voltage across the battery reaches $V_{n-1}$.

6 Claims, 8 Drawing Sheets

(51) Int. Cl.
    *H01M 10/0525* (2010.01)
    *G01R 31/382* (2019.01)
    *H01M 10/48* (2006.01)

(52) U.S. Cl.
    CPC ......... *H01M 10/44* (2013.01); *H01M 10/443* (2013.01); *H01M 10/48* (2013.01); *H01M 10/486* (2013.01); *H02J 7/008* (2013.01); *H02J 7/0071* (2020.01); *H02J 7/00712* (2020.01); *H02J 7/0048* (2020.01); *H02J 7/0091* (2013.01); *H02J 7/00714* (2020.01); *H02J 7/007182* (2020.01); *Y02E 60/10* (2013.01); *Y02E 60/13* (2013.01)

(58) Field of Classification Search
    CPC ............. H01M 10/443; H01M 10/486; H01M 10/0525; H01M 10/48; H01M 10/44; G01R 31/382
    USPC ................................................. 320/160, 134
    See application file for complete search history.

(56) References Cited

U.S. PATENT DOCUMENTS

| | | | | |
|---|---|---|---|---|
| 5,617,007 | A * | 4/1997 | Keidl | H02J 7/00711 320/141 |
| 5,686,815 | A * | 11/1997 | Reipur | G01R 31/3832 320/116 |
| 5,864,220 | A * | 1/1999 | Reipur | H01M 10/443 320/134 |
| 5,889,385 | A * | 3/1999 | Podrazhansky | H02J 7/00711 320/130 |
| 6,037,751 | A * | 3/2000 | Klang | H01M 10/44 320/129 |
| 6,091,229 | A * | 7/2000 | Oglesbee | H02J 7/022 320/137 |
| 6,104,165 | A * | 8/2000 | Miyamoto | H01M 10/44 320/125 |
| 6,414,465 | B1 * | 7/2002 | Banks | H01M 10/48 320/118 |
| 6,771,046 | B2 * | 8/2004 | Ariga | H02J 7/0069 320/125 |
| 6,781,348 | B2 * | 8/2004 | Yokohama | H02J 7/0071 320/125 |
| 7,012,405 | B2 * | 3/2006 | Nishida | H02J 7/00711 320/137 |
| 7,261,979 | B2 * | 8/2007 | Gozdz | H01M 4/133 429/231.95 |
| 7,274,171 | B2 * | 9/2007 | Nishida | H02J 7/0071 320/137 |
| 7,348,101 | B2 * | 3/2008 | Gozdz | H01M 4/133 429/231.95 |
| 7,659,690 | B2 * | 2/2010 | Bolgiani | B60K 6/445 320/104 |
| 7,772,852 | B2 * | 8/2010 | Fechalos | G01R 31/389 324/430 |
| 7,799,461 | B2 * | 9/2010 | Gozdz | H01M 4/5825 429/231.95 |
| 7,880,445 | B2 * | 2/2011 | Hussain | H02J 7/0071 320/164 |
| 8,030,902 | B2 * | 10/2011 | Kung | H02J 7/0022 320/160 |
| 8,080,338 | B2 * | 12/2011 | Gozdz | H01M 4/587 429/221 |
| 8,106,629 | B2 * | 1/2012 | Lai | H02J 7/0071 320/128 |
| 8,193,780 | B2 * | 6/2012 | Hussain | H02J 7/0071 320/164 |
| 8,288,995 | B2 * | 10/2012 | Jimbo | H02J 7/0018 320/126 |
| 8,471,533 | B2 * | 6/2013 | Hussain | H02J 7/007 320/164 |
| 8,519,671 | B2 * | 8/2013 | Bao | H02J 7/0071 320/128 |
| 8,643,342 | B2 * | 2/2014 | Mehta | H02J 7/0071 320/160 |
| 8,896,272 | B2 * | 11/2014 | Hawawini | H01M 10/44 320/160 |
| 8,912,762 | B2 * | 12/2014 | Suzuki | H01M 4/525 320/160 |
| 8,917,060 | B2 * | 12/2014 | Shigemizu | H01M 10/441 320/118 |
| 8,975,870 | B2 * | 3/2015 | Maruyama | H02J 7/0016 320/118 |
| 8,981,733 | B2 * | 3/2015 | Hussain | H02J 7/007 320/164 |
| 9,054,396 | B2 * | 6/2015 | Cheng | H01M 10/44 |
| 9,148,028 | B2 * | 9/2015 | Suzuki | H02J 7/0014 |
| 9,178,372 | B2 * | 11/2015 | Zhao | H02J 7/007 |
| 9,178,380 | B2 * | 11/2015 | Kawai | H02J 7/045 |
| 9,190,864 | B2 * | 11/2015 | Ogihara | H01M 4/505 |
| 9,379,565 | B2 * | 6/2016 | Woo | H02J 7/0071 |
| 9,655,383 | B2 * | 5/2017 | Holzherr | H02J 7/00 |
| 9,728,991 | B2 * | 8/2017 | Jagenstedt | H02J 7/0071 |
| 9,793,736 | B2 * | 10/2017 | Luo | H02J 7/00711 |
| 9,871,393 | B2 * | 1/2018 | Hao | H02J 7/0031 |
| 10,084,333 | B2 * | 9/2018 | Zeng | H02J 7/0091 |
| 10,135,277 | B2 * | 11/2018 | Heo | G01R 31/3835 |
| 10,164,456 | B2 * | 12/2018 | Luo | H02J 7/008 |
| 10,177,589 | B2 * | 1/2019 | Johnson, Jr. | H02J 7/0071 |
| 10,211,659 | B2 * | 2/2019 | Tian | H02J 7/0077 |
| 10,236,702 | B2 * | 3/2019 | Ha | H02J 7/0069 |
| 10,291,051 | B2 * | 5/2019 | Pourdarvish | H01M 10/44 |
| 10,424,958 | B2 * | 9/2019 | Tian | H02J 7/0077 |
| 10,447,054 | B2 * | 10/2019 | Christensen | G01R 31/367 |
| 10,536,006 | B2 * | 1/2020 | Zhang | H02J 7/00714 |
| 10,541,541 | B2 * | 1/2020 | Zhang | H02J 7/0019 |
| 10,553,913 | B2 * | 2/2020 | Kanomata | H01M 10/44 |
| 10,566,816 | B2 * | 2/2020 | Jang | H02J 7/007 |
| 10,727,679 | B2 * | 7/2020 | Zhang | H02J 7/0014 |
| 2002/0000788 | A1 * | 1/2002 | Ostergaard | H02J 7/0071 320/128 |
| 2003/0141852 | A1 * | 7/2003 | Ljunggren | H02J 7/045 320/162 |
| 2003/0184261 | A1 * | 10/2003 | Yokoyama | H02J 7/007184 320/125 |
| 2005/0233219 | A1 * | 10/2005 | Gozdz | H01M 4/136 429/231.95 |
| 2005/0233220 | A1 * | 10/2005 | Gozdz | H01M 4/136 429/231.95 |
| 2007/0188139 | A1 * | 8/2007 | Hussain | H02J 7/007 320/128 |
| 2008/0007220 | A1 * | 1/2008 | Bolgiani | H02J 7/0071 320/128 |
| 2008/0169790 | A1 * | 7/2008 | Gozdz | H01M 4/5825 320/160 |
| 2008/0197812 | A1 * | 8/2008 | Maireanu | H02J 7/0068 320/145 |
| 2009/0278507 | A1 * | 11/2009 | Lai | H02J 7/0071 320/162 |
| 2009/0295338 | A1 * | 12/2009 | Hawawini | H02J 7/0071 320/157 |
| 2010/0066311 | A1 * | 3/2010 | Bao | H02J 7/0071 320/162 |
| 2010/0156356 | A1 * | 6/2010 | Asakura | H01M 2/16 320/148 |
| 2010/0327810 | A1 * | 12/2010 | Jimbo | H02J 7/0018 320/126 |
| 2011/0081577 | A1 * | 4/2011 | Gozdz | H01M 4/587 429/221 |
| 2011/0089893 | A1 * | 4/2011 | Hussain | H02J 7/007 320/107 |
| 2011/0156660 | A1 * | 6/2011 | Cheng | H02J 7/0077 320/157 |
| 2011/0156661 | A1 * | 6/2011 | Mehta | H02J 7/0071 320/160 |
| 2011/0169459 | A1 * | 7/2011 | Chen | H02J 7/00309 320/160 |

(56) References Cited

U.S. PATENT DOCUMENTS

| | | | |
|---|---|---|---|
| 2011/0221394 A1* | 9/2011 | Shigemizu | H02J 7/0016 320/118 |
| 2012/0001595 A1* | 1/2012 | Maruyama | H02J 7/0016 320/118 |
| 2012/0130661 A1* | 5/2012 | Hagimori | G01R 31/3842 702/63 |
| 2012/0133338 A1* | 5/2012 | Suzuki | H01M 10/44 320/160 |
| 2012/0223682 A1* | 9/2012 | Hussain | H02J 7/007 320/164 |
| 2013/0063079 A1* | 3/2013 | Kawai | H02J 7/045 320/107 |
| 2013/0113432 A1* | 5/2013 | Suzuki | H02J 7/0014 320/134 |
| 2013/0207618 A1* | 8/2013 | Renken | H02J 7/00 320/155 |
| 2013/0221903 A1* | 8/2013 | Hwang | H02J 7/045 320/107 |
| 2013/0257358 A1* | 10/2013 | Hussain | H02J 7/007 320/107 |
| 2013/0285599 A1* | 10/2013 | Hao | H01M 10/443 320/107 |
| 2014/0015495 A1* | 1/2014 | Woo | H02J 7/0071 320/160 |
| 2014/0047248 A1* | 2/2014 | Heo | H02J 7/0063 713/300 |
| 2014/0132225 A1* | 5/2014 | Jagenstedt | H02J 7/0071 320/160 |
| 2014/0375279 A1* | 12/2014 | Nishino | H01M 10/443 320/160 |
| 2015/0181942 A1* | 7/2015 | Holzherr | H01M 2/1027 131/328 |
| 2015/0188327 A1* | 7/2015 | Ogihara | H01M 10/44 320/107 |
| 2015/0357859 A1* | 12/2015 | Pourdarvish | H02J 7/0077 320/159 |
| 2016/0111898 A1* | 4/2016 | Luo | H02J 7/00711 320/162 |
| 2016/0218531 A1* | 7/2016 | Li | H02J 7/0071 |
| 2016/0344219 A1* | 11/2016 | Lee | H02J 7/0069 |
| 2017/0229877 A1* | 8/2017 | Zhang | H02J 7/00711 |
| 2017/0244255 A1* | 8/2017 | Luo | H01M 10/44 |
| 2017/0256961 A1* | 9/2017 | Zeng | H02J 7/0047 |
| 2017/0271887 A1* | 9/2017 | Heo | G01R 31/3835 |
| 2017/0310137 A1* | 10/2017 | Ha | G01R 31/3648 |
| 2017/0338666 A1* | 11/2017 | Christensen | H01M 10/425 |
| 2017/0352926 A1* | 12/2017 | Kanomata | H02J 7/007 |
| 2017/0366015 A1* | 12/2017 | Luo | H02J 7/00 |
| 2018/0050598 A1* | 2/2018 | Eriksson | G01R 31/386 |
| 2018/0054068 A1* | 2/2018 | Jang | H02J 7/00712 |
| 2018/0067167 A1* | 3/2018 | Ide | G01R 31/3842 |
| 2018/0090962 A1* | 3/2018 | Cha | G01K 1/024 |
| 2018/0123354 A1* | 5/2018 | Lim | H02J 7/0071 |
| 2018/0205236 A1* | 7/2018 | Fu | H01M 10/48 |
| 2018/0241083 A1* | 8/2018 | Takami | H01M 2/348 |
| 2018/0269697 A1* | 9/2018 | Zhang | H02J 7/0068 |
| 2018/0358818 A1* | 12/2018 | Zhang | H02J 7/0068 |
| 2019/0097432 A1* | 3/2019 | Du | H01M 4/505 |
| 2019/0097433 A1* | 3/2019 | Zou | H01M 10/486 |
| 2019/0097441 A1* | 3/2019 | Chen | H02J 7/00714 |
| 2019/0115769 A1* | 4/2019 | Chen | H02J 7/0016 |
| 2019/0184836 A1* | 6/2019 | Smith | B60L 58/13 |
| 2019/0222051 A1* | 7/2019 | Pourdarvish | H02J 7/0077 |
| 2019/0229538 A1* | 7/2019 | Zhang | H02J 7/0024 |
| 2019/0237974 A1* | 8/2019 | Dang | H02J 7/007 |
| 2020/0106276 A1* | 4/2020 | Zhang | H02J 7/00036 |
| 2020/0119562 A1* | 4/2020 | Jung | H02J 7/007 |

FOREIGN PATENT DOCUMENTS

| | | | |
|---|---|---|---|
| CN | 101953015 A | 1/2011 | |
| CN | 102365804 A | 2/2012 | |
| CN | 102473969 A | 5/2012 | |
| CN | 103267952 A | 8/2013 | |
| JP | 5541112 B2 * | 7/2014 | H02J 7/0071 |

* cited by examiner

S510 — Gradually reduce the charging current $I_{n-1}$ at a predetermined speed, when the charging process proceeds from the N-1th charging stage to the Nth charging stage or stops United States Patent US 10,886,766 B2

METHOD AND DEVICE FOR MULTI-STAGE BATTERY CHARGING

CROSS-REFERENCE TO RELATED APPLICATION

This application is based upon and claims priority to Chinese Patent Application No. 201710298449.4, filed on Apr. 28, 2017, the content of which is incorporated herein by reference in its entirety.

FIELD

The present disclosure relates to the field of battery technology, and more particularly to a method, an apparatus and a device for charging a battery.

BACKGROUND

With the gradual depletion of non-renewable energy such as oil, there may be an outbreak of energy crisis in the foreseeable future. For this reason, in recent years, electric power energy such as a Lithium-ion power battery is very popular in the new energy market. Meanwhile, the requirements for the battery's performance, especially for the battery's fast charging performance are getting higher.

In most of existing battery charging technologies, for example, a charging technique utilizing a charging pile, a constant current charging is employed, rather than a constant voltage charging.

When performing high rate charging for a power battery, a big current up to a few hundred amperes may usually flow through the battery. Most charging piles cannot instantly reduce the big current to zero, but continue charging the battery with the slowly dropping current. In order to prevent overcharging the battery, the charging piles generally do not directly charge the battery up to the cutoff voltage of the battery during the charging process. As a result, such a charging process may lead to an insufficient charge capacity or a low charging efficiency and therefore may not make a full use of the charging capability of the battery cell.

SUMMARY

A method, an apparatus and a device for charging a battery are provided in the present disclosure.

According to a first aspect, a method for charging a battery is provided. The method may include: defining a charging current $I_n$ for an Nth charging stage of a charging process based on charging capability of the battery, wherein the charging current $I_n$ is smaller than a charging current $I_{n-1}$ for an N−1th charging stage; defining a charge cutoff voltage $V_n$ for the Nth charging stage of the charging process, wherein the charge cutoff voltage $V_n$ corresponds to the charging current $I_n$, and the charge cutoff voltage $V_n$ is larger than a charge cutoff voltage $V_{n-1}$ for the N−1th charging stage and smaller than a theoretical charge cutoff voltage $V_{max}$ of the battery; in case that the N−1th charging stage is not a last charging stage of the charging process, charging the battery with the charging current $I_{n-1}$ during the N−1th charging stage and proceeding to the Nth charging stage when a voltage across the battery reaches $V_{n-1}$; and in case that the N−1th charging stage is the last charging stage of the charging process, charging the battery with the charging current $I_{n-1}$ during the N−1th charging stage and stopping charging when the voltage across the battery reaches $V_{n-1}$, wherein, N is an integer larger than 1.

According to a second aspect, an apparatus for charging a battery is provided. The apparatus may include a current defining unit, a voltage defining unit and a charging unit. The current defining unit may be configured to define a charging current $I_n$ for an Nth charging stage of a charging process based on charging capability of the battery, wherein the charging current $I_n$ is smaller than a charging current $I_{n-1}$ for an N−1th charging stage. The voltage defining unit may be configured to define a charge cutoff voltage $V_n$ for the Nth charging stage of the charging process, wherein the charge cutoff voltage $V_n$ corresponds to the charging current $I_n$, and the charge cutoff voltage $V_n$ is larger than a charge cutoff voltage $V_{n-1}$ for the N−1th charging stage and smaller than a theoretical charge cutoff voltage $V_{max}$ of the battery. The charging unit may be configured to charge the battery with the charging current $I_{n-1}$ during the N−1th charging stage and proceed to the Nth charging stage when a voltage across the battery reaches $V_{n-1}$, in case that the N−1th charging stage is not a last charging stage of the charging process; and charge the battery with the charging current $I_{n-1}$ during the N−1th charging stage and stop charging when the voltage across the battery reaches $V_{n-1}$, in case that the N−1th charging stage is the last charging stage of the charging process, wherein, N is an integer larger than 1.

According to a third aspect, a device for charging a battery is provided. The device may include a processor and a memory. The memory is to store executable program code. The processor is configured to read the executable program code stored in the memory to perform the method described above.

BRIEF DESCRIPTION OF THE DRAWINGS

To more clearly illustrate technical solutions of embodiments of the present disclosure, the accompanying drawings, which are to be referred by the embodiments of the present invention, will be briefly described. It will be apparent that the accompanying drawings described below illustrate merely some embodiments of the present disclosure. Those skilled in the art will be able to obtain additional drawings in accordance with these drawings without any creative work.

DETAILED DESCRIPTION

Various aspects of features and exemplary embodiments of the present disclosure will be described in detail in the following. In the detailed description below, numerous specific details are set forth to provide a thorough understanding of the present disclosure. However, it is obvious to those skilled in the art that the present disclosure can be practiced without some of these specific details. The description of embodiments below is merely to provide a better understanding of the present disclosure by illustrating examples of the present disclosure.

It is to be noted that the features in the embodiments in the present application may be combined with each other in case that there is no conflict. The embodiments will be described in detail below with reference to the accompanying drawings.

Figure 1:
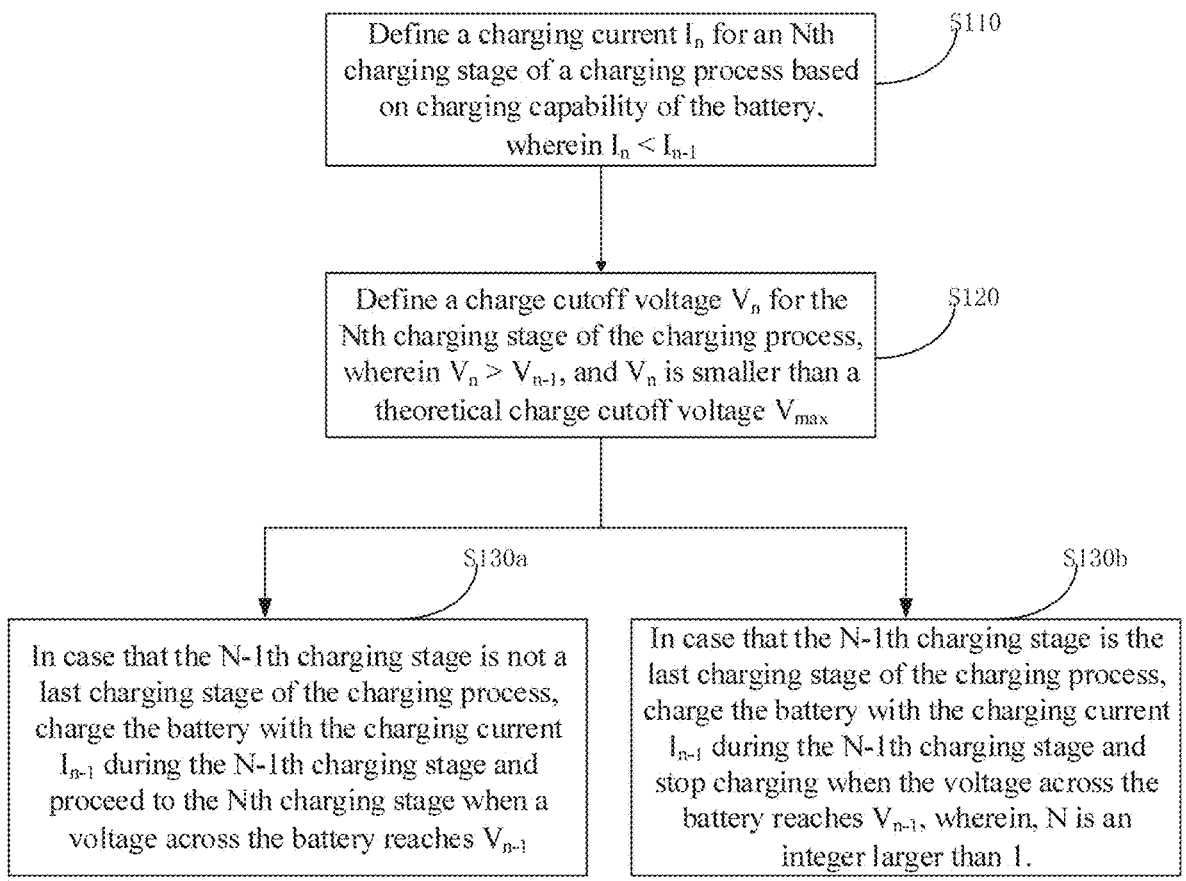
FIG. 1 is a schematic flow chart illustrating a method for charging a battery in accordance with an embodiment of the present disclosure.

FIG. 1 is a schematic flow chart illustrating a method for charging a battery in accordance with an embodiment of the present disclosure. As shown in FIG. 1, the method may include the following steps.

At S110, a charging current $I_n$ may be defined for the Nth charging stage of the charging process based on charging capability of the battery. Here, the charging current $I_n$ for the Nth charging stage is smaller than the charging current $I_{n-1}$ for the N-1th charging stage.

In some examples, the battery may be a variety of types of power storage units. For example, the battery may be a lithium ion power storage unit, a lithium metal power storage unit, a lead acid power storage unit, a nickel cadmium power storage unit, a nickel hydrogen power storage unit, a lithium sulfur power storage unit, a lithium air power storage unit, or a sodium ion power storage unit.

In some examples, the charging capability of the battery may be characterized by the maximum charging current that the battery can withstand. Thus, the step of defining the charging current $I_n$ for the Nth charging stage of the charging process based on the charging capability of the battery at S110 may be defining the charging current $I_n$ for the Nth charging stage of the charging process based on the maximum charging current that the battery can withstand.

In the embodiment, since $I_n<I_{n-1}$, the charging current for the first charging stage of the entire charging process is the maximum charging current among the charging currents for all charging stages of the entire charging process.

In some examples, the defined charging current $I_1$ for the first charging stage of the entire charging process may be determined depending on the maximum charging current that the battery can withstand. For instance, $I_1$ may be defined to be a current smaller than or equal to the maximum charging current that the battery can withstand.

At S120, a charge cutoff voltage $V_n$ corresponding to the charging current $I_n$ may be defined for the Nth charging stage of the charging process. Here, $V_n>V_{n-1}$, and $V_n$ is smaller than a theoretical charge cutoff voltage $V_{max}$.

In some examples, a set of the charging current $I_n$ and the corresponding charge cutoff voltage $V_n$ may be defined for each charging stage.

At S130a, in case that the N-1th charging stage is not the last charging stage of the charging process, the battery may be charged with the charging current $I_{n-1}$ during the N-1th charging stage and the charging process may proceed to the Nth charging stage once the voltage across the battery reaches $V_{n-1}$.

In some examples, in case that the N-1th charging stage is not the last charging stage of the charging process, the battery may be charged with the charging current $I_{n-1}$ during the N-1th charging stage. Once the voltage across the battery reaches $V_{n-1}$, the charging process may proceed to the Nth charging stage at which the battery may be charged with the charging current $I_n$. In some examples, it may be difficult to instantly reduce the charging current $I_{n-1}$ to the charging current $I_n$. In this case, when the charging process proceeds to the N-1th charging stage from the Nth charging stage, the charging current $I_{n-1}$ may be gradually reduced to the charging current $I_n$.

At S130b, in case that the N-1th charging stage is the last charging stage of the charging process, the battery may be charged with the charging current $I_{n-1}$ during the N-1th charging stage and the charging process may stop once the voltage across the battery reaches $V_{n-1}$. Here, N is an integer larger than 1.

In some examples, in case that the N-1th charging stage is the last charging stage of the charging process, the battery may be charged with the charging current $I_{n-1}$ during the N-1th charging stage and the charging process may stop once the voltage across the battery reaches $V_{n-1}$. In other words, once the voltage across the battery reaches $V_{n-1}$, the charging current $I_{n-1}$ may be reduced to 0. In some examples, it may be difficult to immediately reduce the charging current from $I_{n-1}$ to 0. In this case, when the charging process stops after the N-1th charging stage, the charging current $I_{n-1}$ may be gradually reduced to 0.

In some examples, an ambient temperature of the battery may be maintained within the range of 0 to 60° C. during the charging process. For example, the battery may be charged under the ambient temperature of 0° C., 25° C., 30° C. or 60° C.

Consequently, according to the method for charging the battery provided by the embodiment of the present disclosure, the charging process may be divided into a plurality of charging stages, and a charging current and a charge cutoff voltage may be defined for each of the plurality of charging stages. The defined charging current may progressively decrease as the charging process proceeds from a charging stage to a next charging stage, while the corresponding defined charge cutoff voltage may progressively increase as the charging process proceeds from the charging stage to the next charging stage. During each charging stage, the battery may be charged with the charging current defined for the charging stage, and once the voltage across the battery reaches the charge cutoff voltage defined for the charging stage, the charging process may proceed to the next charging stage. Further, when the voltage across the battery reaches the charge cutoff voltage defined for the last charging stage, the charging process may stop. Charging efficiency and charge capacity of the battery may be improved effectively by utilizing the above described method for charging the battery.

Figure 2:
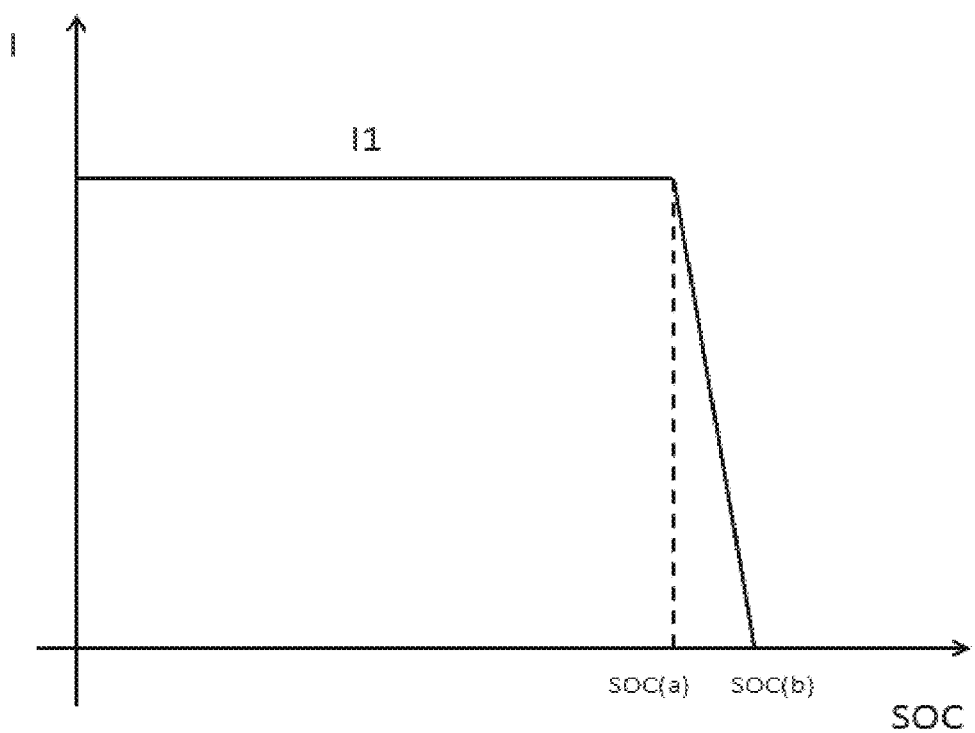
FIG. 2 shows a comparison of I-SOC curves at a certain charging stage of a process for charging a battery in accordance with an embodiment of the present disclosure.

FIG. 2 shows a comparison of I-SOC curves at a certain charging stage of the charging process in accordance with an embodiment of the present disclosure. As shown in FIG. 2, horizontal coordinates represent state of charge (SOC) of the battery, which indicates the current remaining charge capacity of the battery; and vertical coordinates represent the charging current I.

Given the charging current $I_1$, during the charging process, when the voltage across the battery reaches the defined charge cutoff voltage V1, the charging process may keep charging the battery while gradually reducing the charging current $I_1$ to 0. In this case, the charge capacity of the battery may be represented by SOC (b). In the figure, SOC (a) represents the charge capacity of the battery when the open circuit voltage (OCV) of the battery reaches a theoretical charge cutoff voltage $V_{max}$ during the charging process utilizing the constant charging current $I_1$. It can be seen that SOC (b) is larger than SOC (a). It is noted that the voltage across the battery may be regarded as the open circuit voltage of the battery.

Figure 3:
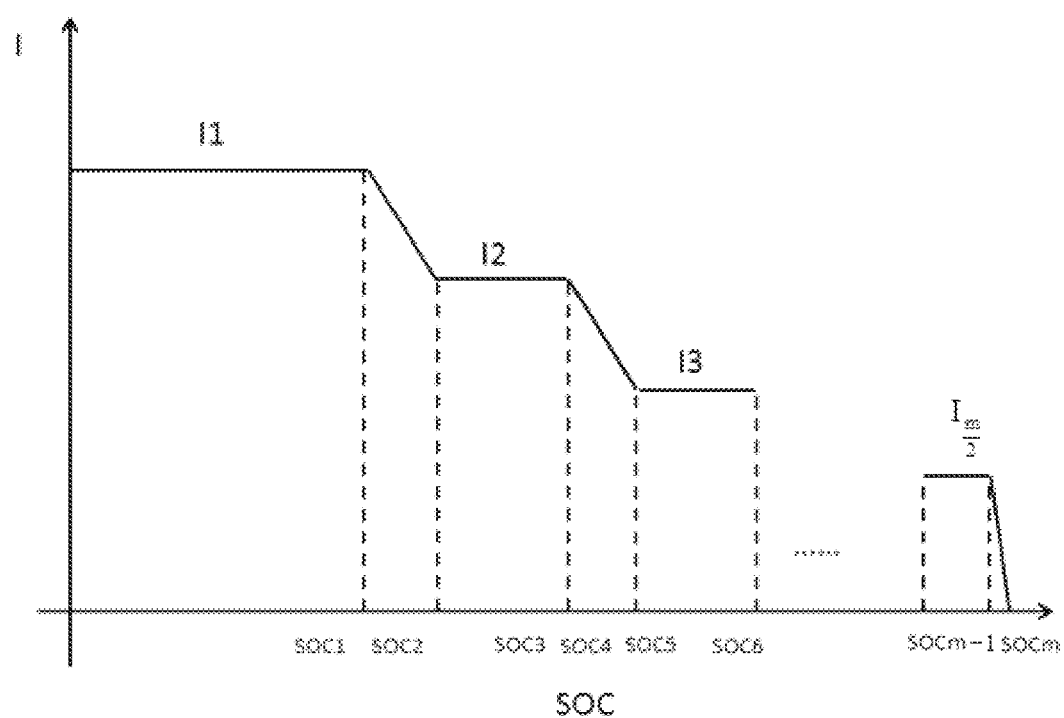
FIG. 3 shows a comparison of I-SOC curves for illustrating charge capacity of a battery during a process for charging the battery in accordance with an embodiment of the present disclosure.

FIG. 3 shows a comparison of I-SOC curves for illustrating a charge capacity of the battery during the charging process in accordance with an embodiment of the present disclosure. As shown in FIG. 3, horizontal coordinates represent state of charge (SOC) of the battery, which indicates the current remaining charge capacity of the battery; and vertical coordinates represent the charging current I.

In the figure, SOC1, SOC 3, . . . or SOCm−1 may respectively represent the charge capacity of the battery when the open circuit voltage OCV of the battery reaches a theoretical charge cutoff voltage $V_1, V_2, \ldots,$ or $V_{max}$ during each charging stage utilizing a constant charging current $I_1, I_2, \ldots,$ or $I_{m/2}$ of the charging process.

In contrast, SOC2, SOC 4, . . . or SOCm may respectively represent the charge capacity of the battery corresponding to each charging stage of the charging process in accordance with the embodiment. During each charging stage, the battery may be charged with the charging current $I_1, I_2, \ldots,$ or $I_{m/2}$ respectively and once the voltage across the battery reaches a defined charge cutoff voltage $V_1, V_2, \ldots,$ or $V_{m/2}$, the charging process may proceed to the next charging stage by gradually reducing the charging current. Eventually, the charging current may be gradually reduced from $I_{m/2}$ to 0.

As can be seen from FIG. 3, both the charging efficiency and the charge capacity of the battery may be improved by the charging process of FIG. 1, as compared to the charging method utilizing constant charging currents.

Figures 4, 5:
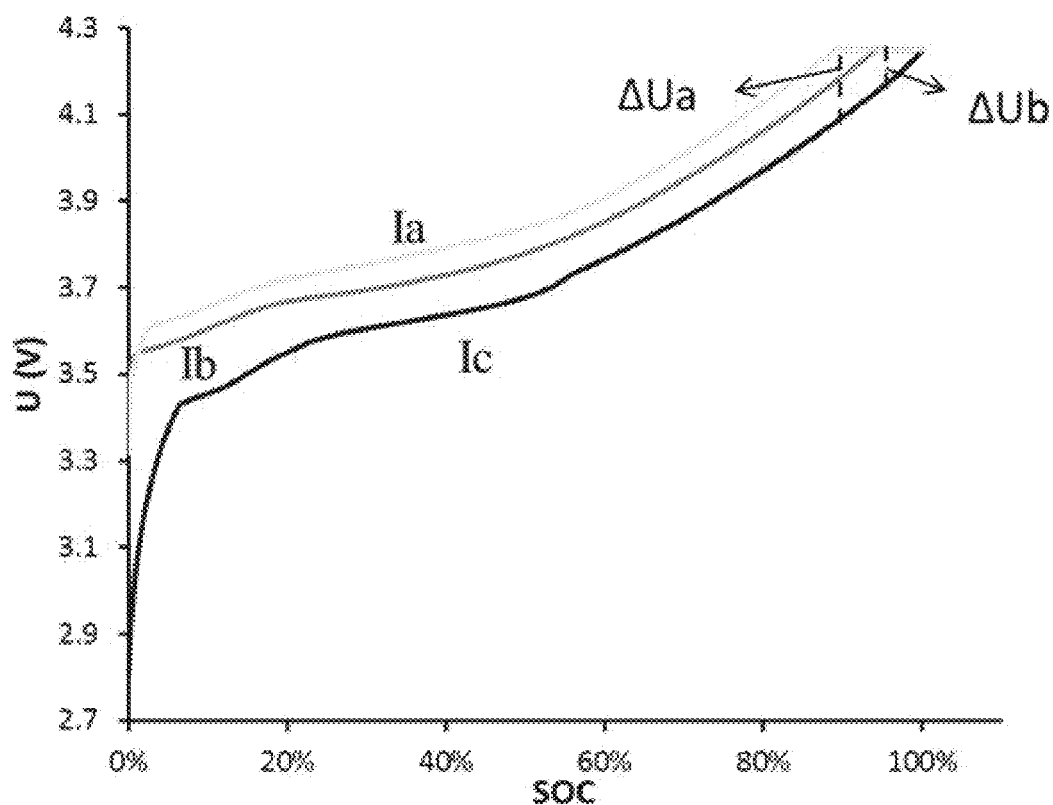
FIG. 4 shows a comparison of SOC-V curves under different charging currents for a charging method with a constant charging voltage and a constant charging current.
FIG. 5 is a schematic flow chart illustrating a method for charging a battery in accordance with another embodiment of the present disclosure.

FIG. 4 shows a comparison of SOC-V curves under different charging currents for a charging method with a constant charging voltage and a constant charging current. As an example, the ambient temperature of the battery may be maintained at 25'C. As shown in FIG. 4, horizontal coordinates represent SOC of the battery; and vertical coordinates represent the open circuit voltage of the battery.

In the figure, the curve Ia represents a SOC-V curve when the battery is charged with a constant current $I_a$; the curve Ib represents a SOC-V curve when the battery is charged with a constant current $I_b$; and the curve Ic represents a SOC-V curve when the battery is charged with a constant tiny current $I_c$ (e.g. a charging current of 0.05c). Here, the curve Ic may also be referred to as an OCV curve.

As shown in FIG. 4, when the voltage across the battery on the curve Ia or Ib reaches the charge cutoff voltage, the voltage across the battery on the curve Ic has not reached the charge cutoff voltage and thus at this moment, there is a voltage difference ΔUa or ΔUb between the charge cutoff voltage and the voltage across the battery on the curve Ic. So it is apparent that the SOC on the curve Ia or Ib at the moment when the voltage across the battery on the curve Ia or Ib reaches the charge cutoff voltage (e.g. Vc) is smaller than the SOC on the curve Ic at the moment when the voltage across the battery on the curve Ic reaches the charge cutoff voltage. Furthermore, when the voltage across the battery on the curves Ia or Ib reaches the charge cutoff voltage, the battery may be overcharged if the charging current $I_a$ or $I_b$ cannot be instantly reduced to 0.

In some examples, the charge cutoff voltage $V_n$ may be defined with the following formula at S120:

$$V_n = V_{max} - I_n \times DCR$$

Here, the DCR represents a DC resistance of the battery.

In some examples, when the charging current $I_n$ and the charge cutoff voltage for each charging stage are defined to satisfy the above formula $V_n = V_{max} - I_n \times DCR$ in the above described charging process, the overcharge of the battery at the last charging stage may be more effectively avoided.

FIG. 5 is a schematic flow chart illustrating a method for charging a battery in accordance with another embodiment of the present disclosure. As shown in FIG. 5, the method may further include gradually reducing the charging current $I_{n-1}$ at a predetermined speed at S510, when the charging process proceeds from the N−1th charging stage to the Nth charging stage or stops. For example, the charging current $I_{n-1}$ may be reduced at a speed of 10 A/s.

In the following sections, several specific embodiments are provided to illustrate the method for charging the battery of FIG. 5 and the advantages of the method over conventional battery charging methods.

Embodiment 1

Three charging stages may be set.

A group of sequentially decreasing charging currents with respect to the three charging stages may be defined as {129 A, 86 A, 43 A}.

A group of sequentially increasing charge cutoff voltages with respect to the three charging stages may be defined as {4.1V, 4.2V, 4.23V}.

Here, the charging current $I_n$ and the charge cutoff voltage $V_n$ for each charging stage N may be defined to satisfy the above formula $V_n = V_{max} - I_n \times DCR$ The battery may be charged under an ambient temperature of 25° C.

At the first charging stage, the battery may be charged with the charging current of 129 A until the voltage across the battery reaches the charge cutoff voltage of 4.1V.

Once the voltage across the battery reaches the charge cutoff voltage of 4.1V, the charging current may be reduced from 129 A to 86 A at a speed of 10 A/s.

When the charging current becomes 86 A, the charging process may proceed to the second charging stage, at which the battery may be charged with the charging current of 86 A until the voltage across the battery reaches the charge cutoff voltage of 4.2V.

Once the voltage across the battery reaches the charge cutoff voltage of 4.2V, the charging current may be reduced from 86 A to 43 A at a speed of 10 A/s.

When the charging current becomes 43 A, the charging process may proceed to the third charging stage, at which the battery may be charged with the charging current of 43 A until the voltage across the battery reaches the charge cutoff voltage of 4.23V.

Once the voltage across the battery reaches the charge cutoff voltage of 4.23V, the charging current may be reduced from 43 A to 0 A at a speed of 10 A/s.

Embodiment 2

Three charging stages may be set.

A group of sequentially decreasing charging currents with respect to the three charging stages may be defined as {172 A, 129 A, 43 A}.

A group of sequentially increasing charge cutoff voltages with respect to the three charging stages may be defined as {3.8V, 4.2V, 4.23V}.

Here, the charging current $I_n$ and the charge cutoff voltage $V_n$ for each charging stage N may be defined to satisfy the above formula $V_n=V_{max}-I_n \times DCR$ The battery may be charged under an ambient temperature of 25° C.

At the first charging stage, the battery may be charged with the charging current of 172 A until the voltage across the battery reaches the charge cutoff voltage of 3.8V.

Once the voltage across the battery reaches the charge cutoff voltage of 3.8V, the charging current may be reduced from 172 A to 129 A at a speed of 10 A/s.

When the charging current becomes 129 A, the charging process may proceed to the second charging stage, at which the battery may be charged with the charging current of 129 A until the voltage across the battery reaches the charge cutoff voltage of 4.2V.

Once the voltage across the battery reaches the charge cutoff voltage of 4.2V, the charging current may be reduced from 129 A to 43 A at a speed of 10 A/s.

When the charging current becomes 43 A, the charging process may proceed to the third charging stage, at which the battery may be charged with the charging current of 43 A until the voltage across the battery reaches the charge cutoff voltage of 4.23V.

Once the voltage across the battery reaches the charge cutoff voltage of 4.23V, the charging current may be reduced from 43 A to 0 A at a speed of 10 A/s.

Comparative Embodiment 1

The battery may be charged under an ambient temperature of 25° C., and the charge cutoff voltage may be defined as 4.25V.

The battery may be charged with a constant current of 129 A until the voltage across the battery reaches the charge cutoff voltage of 4.25V.

Figure 6A:
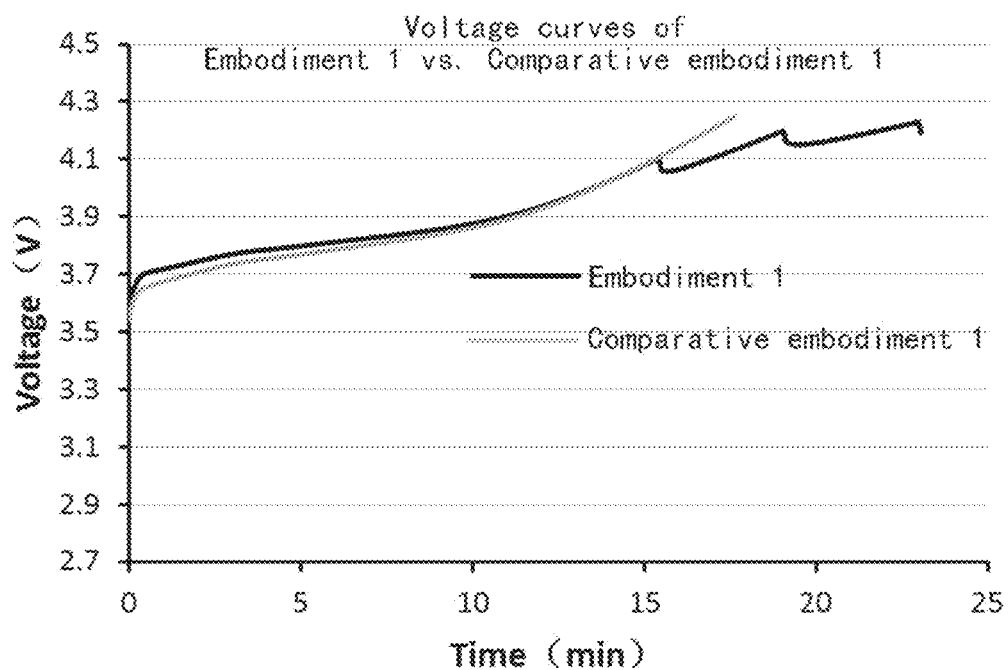
FIG. 6a shows a comparison of Voltage vs. Time curves of a method for charging a battery in accordance with another embodiment of the present disclosure versus a charging method of a comparative embodiment.
Figure 6B:
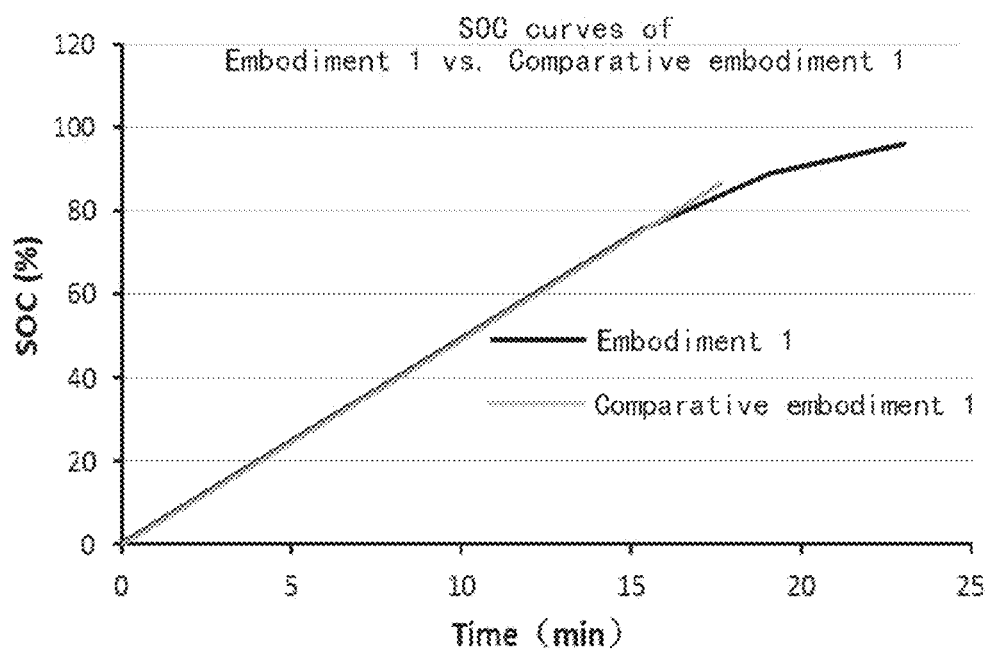
FIG. 6b shows a comparison of SOC vs. Time curves of a method for charging a battery in accordance with another embodiment of the present disclosure versus a charging method of a comparative embodiment.
Figure 7A:
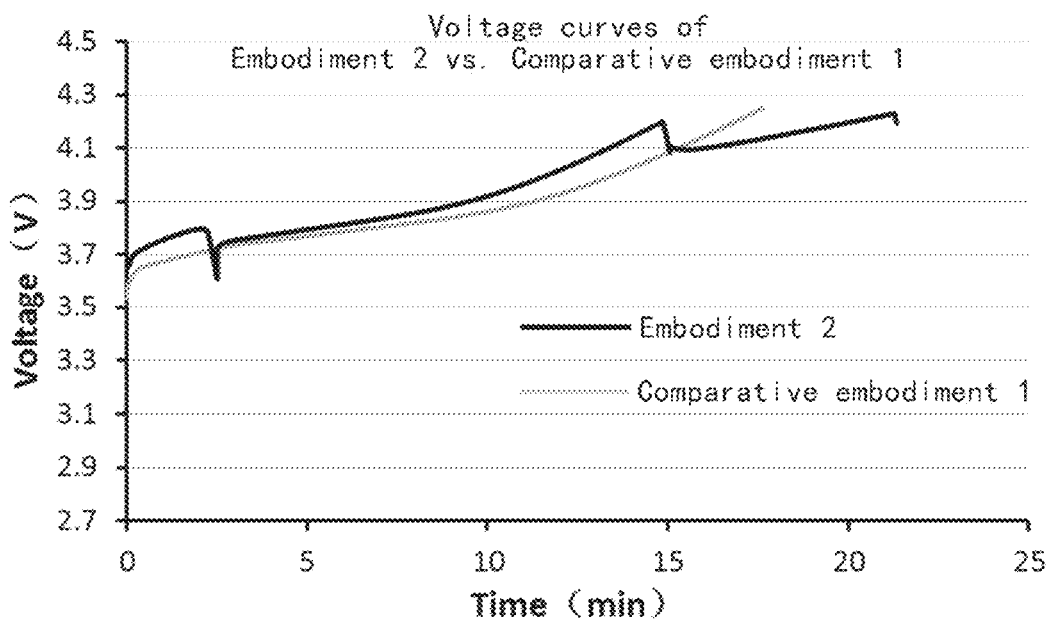
FIG. 7a shows a comparison of Voltage vs. Time curves of a method for charging a battery in accordance with a further embodiment of the present disclosure versus a charging method of a comparative embodiment.
Figure 7B:
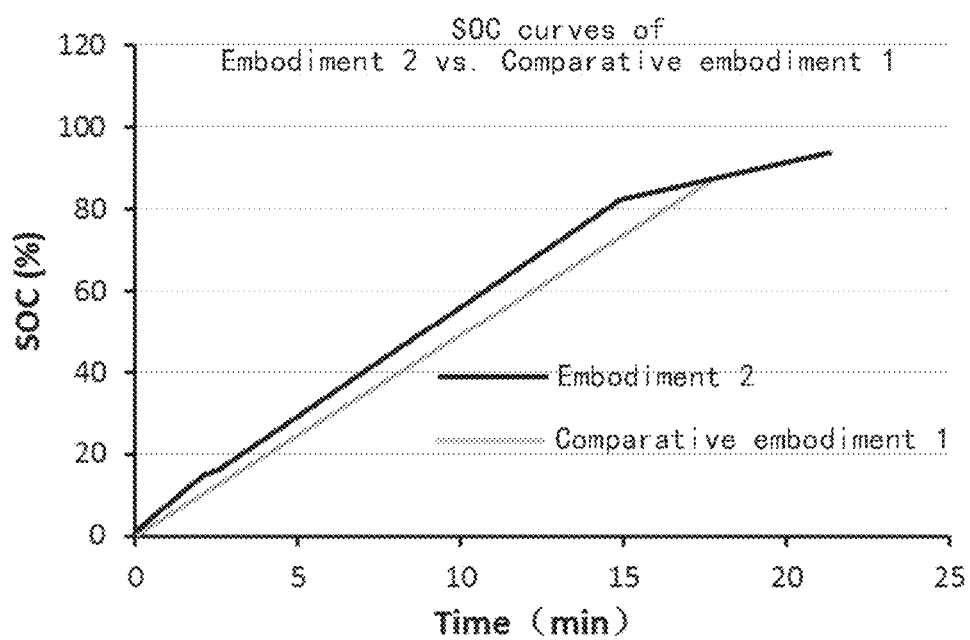
FIG. 7b shows a comparison of SOC vs. Time curves of a method for charging a battery in accordance with a further embodiment of the present disclosure versus a charging method of a comparative embodiment.

FIG. 6a shows a comparison of Voltage vs. Time curves of a method for charging a battery in accordance with another embodiment of the present disclosure versus a charging method of the comparative embodiment. FIG. 6b shows a comparison of SOC vs. Time curves of a method for charging a battery in accordance with another embodiment of the present disclosure versus a charging method of the comparative embodiment. FIG. 7a shows a comparison of Voltage vs. Time curves of a method for charging a battery in accordance with a further embodiment of the present disclosure versus a charging method of the comparative embodiment. FIG. 7b shows a comparison of SOC vs. Time curves of a method for charging a battery in accordance with a further embodiment of the present disclosure versus a charging method of the comparative embodiment.

The curve Va represents the curve of the voltage across the battery vs. time with respect to the above Embodiment 1. The curve Vb represents the curve of the voltage across the battery vs. time with respect to the above Embodiment 2. The curve Vc represents the curve of the voltage across the battery vs. time with respect to the above comparative embodiment 1.

The curve SOCa represents the curve of the SOC of the battery vs. time with respect to the above Embodiment 1. The curve SOCb represents the curve of the SOC of the battery vs. time with respect to the above Embodiment 2. The curve SOCc represents the curve of the SOC of the battery vs. time with respect to the above comparative embodiment 1.

It is apparent that, with the battery charging process of Embodiment 1 or Embodiment 2, the battery may be charged for a longer period of time before the voltage across the battery reaches a theoretical charge cutoff voltage, as compared to the charging process of the comparative embodiment 1. Furthermore, with the battery charging process of Embodiment 1 or Embodiment 2, the battery may be charged with more capacity, as compared to the charging process of the comparative embodiment 1.

The methods for charging the battery in accordance with embodiments of the present disclosure have been described above with reference to FIG. 1 to FIG. 7. Hereinafter, an apparatus and a device for charging the battery in accordance with embodiments of the present disclosure will be described in detail with reference to FIG. 8 to FIG. 10.

Figure 8:
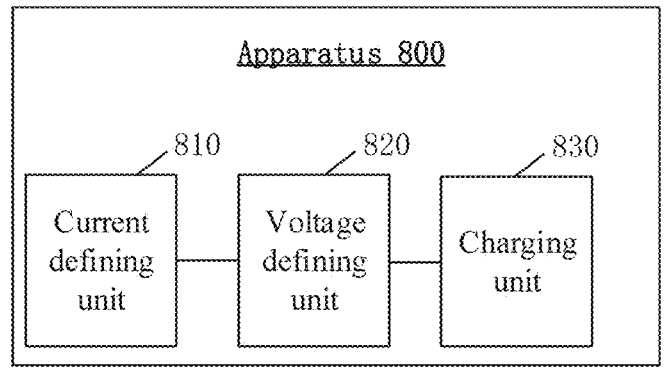
FIG. 8 is a schematic block diagram illustrating an apparatus for charging a battery in accordance with an embodiment of the present disclosure.

FIG. 8 is a schematic block diagram illustrating an apparatus for charging a battery in accordance with an embodiment of the present disclosure. As shown in FIG. 8, the apparatus 800 for charging the battery may include a current defining unit 810, a voltage defining unit 820 and a charging unit 830.

The current defining unit 810 may be configured to define a charging current $I_n$ for the Nth charging stage of a charging process based on charging capability of the battery. Here, the charging current $I_n$ for the Nth charging stage is smaller than the charging current $I_{n-1}$ for the N−1th charging stage.

The voltage defining unit 820 may be configured to define a charge cutoff voltage $V_n$ for the Nth charging stage of the charging process, which corresponds to the charging current $I_n$. Here, $V_n > V_{n-1}$, and $V_n$ is smaller than a theoretical charge cutoff voltage $V_{max}$.

The charging unit 830 may be configured to perform a charging process as follows.

In case that the N−1th charging stage is not the last charging stage of the charging process, the battery may be charged with the charging current $I_{n-1}$ during the N−1th charging stage and the charging process may proceed to the Nth charging stage when the voltage across the battery reaches $V_{n-1}$.

In case that the N−1th charging stage is the last charging stage of the charging process, the battery may be charged with the charging current $I_{n-1}$ during the N−1th charging stage and the charging process stops when the voltage across the battery reaches $V_{n-1}$. Here, N is an integer larger than 1.

Consequently, according to the apparatus for charging the battery provided by the embodiment of the present disclosure, the charging process may be divided into a plurality of charging stages, and a charging current and a charge cutoff voltage may be defined for each of the plurality of charging stages. The defined charging current may progressively decrease as the charging process proceeds from a charging stage to a next charging stage, while the corresponding defined charge cutoff voltage may progressively increase as the charging process proceeds from the charging stage to the next charging stage. During each charging stage, the battery may be charged with the charging current defined for the charging stage, and once the voltage across the battery reaches the charge cutoff voltage defined for the charging stage, the charging process may proceed to the next charging stage. Further, when the voltage across the battery reaches the charge cutoff voltage defined for the last charging stage, the charging process may stop. Charging efficiency and charge capacity of the battery may be improved effectively by utilizing the above described apparatus for charging the battery.

The apparatus 800 for charging the battery in accordance with the embodiment of the present disclosure may be a subject to perform the method for charging the battery in accordance with the embodiment of the present disclosure. Further, each unit of the apparatus 800 may operate to implement a respective step in the process of the method for charging the battery of FIG. 1. For the sake of simplicity, the related description will not be repeated here.

In some examples, the voltage defining unit 820 may be further configured to derive $V_n$ by the formula $V_n = V_{max} - I_n \times DCR$. Here, the DCR represents a DC resistance of the battery.

In some examples, the charging unit 830 may be further configured to gradually reduce the charging current $I_{n-1}$ at a predetermined speed.

In some examples, the battery may be a lithium ion power storage unit, a lithium metal power storage unit, a lead acid power storage unit, a nickel cadmium power storage unit, a nickel hydrogen power storage unit, a lithium sulfur power storage unit, a lithium air power storage unit, or a sodium ion power storage unit.

Figure 9:
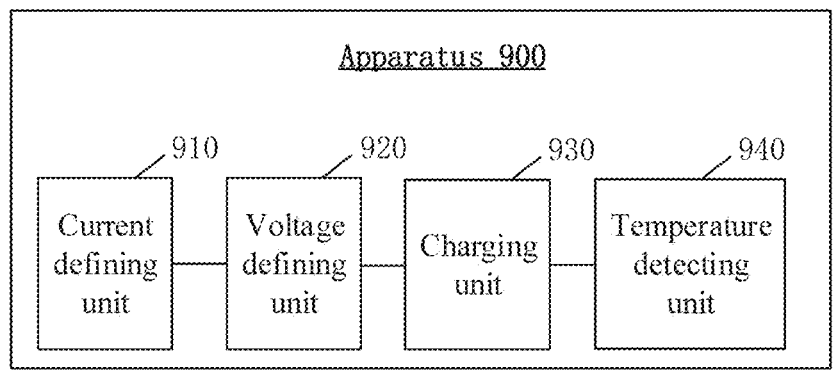
FIG. 9 is a schematic block diagram illustrating an apparatus for charging a battery in accordance with another embodiment of the present disclosure.

FIG. 9 is a schematic block diagram illustrating an apparatus for charging a battery in accordance with another embodiment of the present disclosure. As shown in FIG. 9, the apparatus 900 for charging the battery may include a current defining unit 910, a voltage defining unit 920, a charging unit 930 and a temperature detecting unit 940.

The current defining unit 910 may be configured to define a charging current $I_n$ for the Nth charging stage of a charging process based on charging capability of the battery. Here, the charging current $I_n$ for the Nth charging stage is smaller than the charging current $I_{n-1}$ for the N-1th charging stage.

The voltage defining unit 920 may be configured to define a charge cutoff voltage $V_n$ for the Nth charging stage of the charging process, which corresponds to the charging current $I_n$. Here, $V_n > V_{n-1}$, and $V_n$ is smaller than a theoretical charge cutoff voltage $V_{max}$.

The charging unit 930 may be configured to perform a charging process as follows.

In case that the N-1th charging stage is not the last charging stage of the charging process, the battery may be charged with the charging current $I_{n-1}$ during the N-1th charging stage and the charging process may proceed to the Nth charging stage when the voltage across the battery reaches $V_{n-1}$.

In case that the N-1th charging stage is the last charging stage of the charging process, the battery may be charged with the charging current $I_{n-1}$ during the N-1th charging stage and the charging process stops when the voltage across the battery reaches $V_{n-1}$. Here, N is an integer larger than 1.

The temperature detecting unit 940 may be configured to detect an ambient temperature of the battery and enable the charging unit 930 to charge the battery when the detected ambient temperature is within a range of 0 to 60° C.

Figure 10:
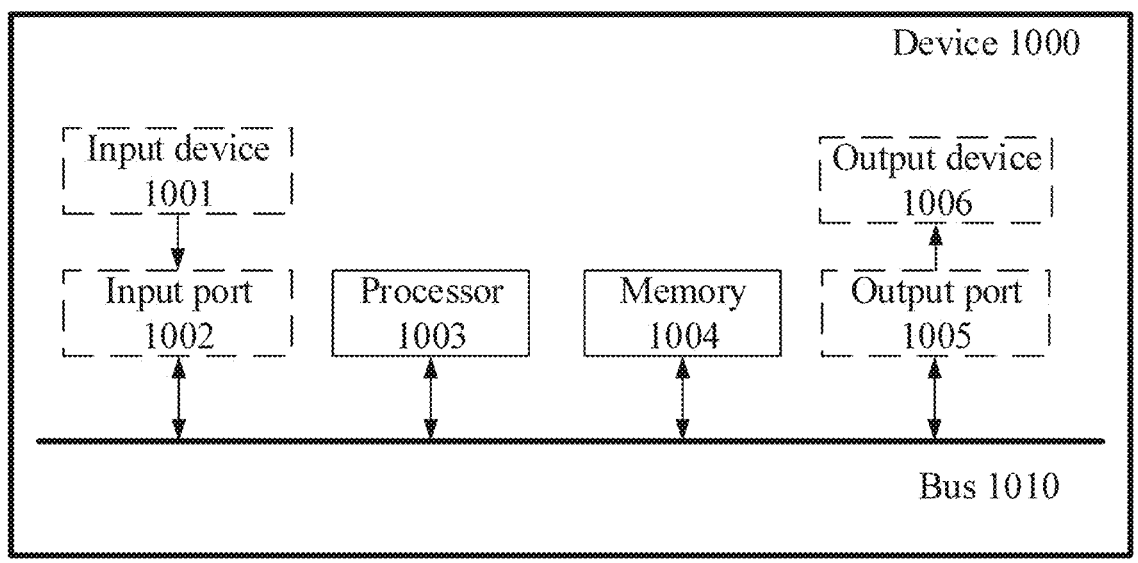
FIG. 10 is a schematic block diagram illustrating a device for charging a battery in accordance with an embodiment of the present disclosure.

FIG. 10 is a schematic block diagram illustrating a device for charging a battery in accordance with an embodiment of the present disclosure. As shown in FIG. 10, at least part of the above described method and apparatus for charging the battery may be implemented by a computer device 1000. The computer device 1000 may include a processor 1003 and a memory 1004.

The memory 1004 may be used to store executable program code.

The processor 1003 may be used to read the executable program code stored in the memory 1004 to perform the above-described method for charging the battery.

Thus, according to the device for charging the battery provided by the embodiment of the present disclosure, the charging process may be divided into a plurality of charging stages, and a charging current and a charge cutoff voltage may be defined for each of the plurality of charging stages. The defined charging current may progressively decrease as the charging process proceeds from a charging stage to a next charging stage, while the corresponding defined charge cutoff voltage may progressively increase as the charging process proceeds from the charging stage to the next charging stage. During each charging stage, the battery may be charged with the charging current defined for the charging stage, and once the voltage across the battery reaches the charge cutoff voltage defined for the charging stage, the charging process may continue charging the battery while gradually reducing the charging current. When the charging current is reduced to a predefined value for the next charging stage, the charging process may proceed to the next charging stage. Charging efficiency and charge capacity of the battery may be improved effectively by utilizing the above described apparatus for charging the battery.

In some illustrating examples, the device 1000 for charging the battery may also include an input device 1001, an input port 1002, an output port 1005, and an output device 1006. The input port 1002, the processor 1003, the memory 1004, and the output port 1005 are connected to each other via a bus 1010. The input device 1001 and the output device 1006 are connected to the bus 1010 through the input port 1002 and the output port 1005 respectively, and further connected to other components of the device 1000.

In some examples, an output interface and an input interface can also be represented by an I/O interface. Specifically, the input device 1001 receives input information from the outside and transmits the input information to the processor 1003 through the input port 1002. For example, the input information is the charging capability of the battery and the theoretical charge cutoff voltage of the battery.

In some examples, the processor 1003 may process the input information based on the computer executable program code or instructions stored in the memory 1004 to generate output information. For example, the processor 1003 may perform the following steps: defining a charging current $I_n$ for the Nth charging stage of a charging process based on charging capability of the battery, wherein the charging current $I_n$ for the Nth charging stage is smaller than the charging current $I_{n-1}$ for the N-1th charging stage; defining a charge cutoff voltage $V_n$ for the Nth charging stage of the charging process, which corresponds to the charging current $I_n$, wherein $V_n > V_{n-1}$ and $V_n$ is smaller than a theoretical charge cutoff voltage $V_{max}$; in case that the N-1th charging stage is not the last charging stage of the charging process, charging the battery with the charging current $I_{n-1}$ during the N-1th charging stage and proceeding to the Nth charging stage when the voltage across the battery reaches $V_{n-1}$; and in case that the N-1th charging stage is the last charging stage of the charging process, charging the battery with the charging current $I_{n-1}$ during the N−1th charging stage and stopping charging when the voltage across the battery reaches $V_{n-1}$, wherein, N is an integer larger than 1. The desired charging current and charge cutoff voltage may be prepared for output as the output information. The output information may be temporarily or permanently stored in the memory 1004, and then the output information may be transferred to the output device 1006 via the output port 1005 as needed. The output device 1006 may output the output information to the outside of the device 1000.

The units described above as separated components may or may not be physically separated, and the component displayed as a unit may or may not be a physical unit, i.e., may be located in one place or may be distributed over a plurality of network elements. The part or all of the units may be selected according to the actual needs to achieve the object of the embodiment of the present invention.

What is claimed is:

1. A method for charging a battery, comprising:
    charging the battery with a first charging current in a first constant current charging stage;
    when a voltage across the battery reaches a first charge cutoff voltage, proceeding to a second constant current charging stage by keeping charging the battery while gradually reducing a charging current from the first charging current to a second charging current at a predetermined speed;
    charging the battery with the second charging current in the second constant current charging stage until the voltage across the battery reaches a second charge cutoff voltage; and when the voltage across battery reaches the second charge cutoff voltage, keeping charging the battery while gradually reducing the charging current from the second charging current to 0 at the predetermined speed,
    wherein the first charging current and the first charge cutoff voltage for the first constant current charging stage and the second charging current and the second charge cutoff voltage for the second constant current charging stage meet the relation of $V=V_{max}-I \times DCR$, where I is a charging current for a constant current charging stage, V is a charge cutoff voltage for the constant current charging stage, $V_{max}$ is a theoretical charge cutoff voltage of the battery, and DCR is a DC resistance of the battery.

2. The method of claim 1, wherein the battery is a lithium ion power storage unit, a lithium metal power storage unit, a lead acid power storage unit, a nickel cadmium power storage unit, a nickel hydrogen power storage unit, a lithium sulfur power storage unit, a lithium air power storage unit, or a sodium ion power storage unit.

3. The method of claim 1, wherein the battery is charged under an ambient temperature within a range of 0 to 60° C.

4. A device for charging a battery, comprising a processor and a memory, wherein:
    the memory is to store executable program code; and
    the processor is configured to read the executable program code stored in the memory to control a charging unit to:
        charge the battery with a first charging current in a first constant current charging stage;
        when the voltage across the battery reaches a first charge cutoff voltage, proceed to a second constant current charging stage by keeping charging the battery while gradually reducing a charging current from the first charging current to a second charging current at a predetermined speed;
        charge the battery with the second charging current in the second constant current charging stage until the voltage across battery reaches a second charge cutoff voltage; and when the voltage across battery reaches the second charge cutoff voltage, keep charging the battery while gradually reducing the charging current from the second charging current to 0 at the predetermined speed,
    wherein the first charging current and the first charge cutoff voltage for the first constant current charging stage and the second charging current and the second charge cutoff voltage for the second constant current charging stage meet the relation of $V=V_{max}-I \times DCR$, where I is a charging current for a constant current charging stage, V is a charge cutoff voltage for the constant current charging stage, $V_{max}$ is a theoretical charge cutoff voltage of the battery, and DCR is a DC resistance of the battery.

5. The method of claim 4, wherein the battery is a lithium ion power storage unit, a lithium metal power storage unit, a lead acid power storage unit, a nickel cadmium power storage unit, a nickel hydrogen power storage unit, a lithium sulfur power storage unit, a lithium air power storage unit, or a sodium ion power storage unit.

6. The method of claim 4, wherein the battery is charged under an ambient temperature within a range of 0 to 60° C.

* * * * *